US009280187B2

(12) United States Patent
Donner (10) Patent No.: US 9,280,187 B2
(45) Date of Patent: Mar. 8, 2016

(54) HOUSING FOR AT LEAST ONE ELECTRIC OR ELECTRONIC DEVICE, AND ELECTRIC OR ELECTRONIC DEVICE COMPRISING THE HOUSING

(71) Applicant: DIEHL AEROSPACE GMBH, Ueberlingen (DE)

(72) Inventor: Bernd Donner, Salem (DE)

(73) Assignee: DIEHL AEROSPACE GMBH, Ueberlingen (DE)

( * ) Notice: Subject to any disclaimer, the term of this patent is extended or adjusted under 35 U.S.C. 154(b) by 59 days.

(21) Appl. No.: 14/324,452

(22) Filed: Jul. 7, 2014

(65) Prior Publication Data

US 2015/0016053 A1    Jan. 15, 2015

(30) Foreign Application Priority Data

Jul. 12, 2013    (DE) .......................... 10 2013 011 693
Oct. 18, 2013    (DE) .......................... 10 2013 017 402

(51) Int. Cl.
*G06F 1/20* (2006.01)
*H05K 5/02* (2006.01)
*H05K 7/20* (2006.01)
*F25D 21/14* (2006.01)

(52) U.S. Cl.
CPC ...... *G06F 1/20* (2013.01); *F25D 21/14* (2013.01); *H05K 5/0213* (2013.01); *H05K 7/20545* (2013.01)

(58) Field of Classification Search
CPC combination set(s) only.
See application file for complete search history.

(56) References Cited

U.S. PATENT DOCUMENTS

| 4,750,087 | A | 6/1988 | Carpenter et al. |
| 5,931,002 | A | 8/1999 | Nagashima |
| 2006/0089096 | A1 | 4/2006 | Wolm |
| 2007/0023881 | A1 | 2/2007 | Strack |
| 2007/0236881 | A1* | 10/2007 | Harder ............... H05K 7/202 361/695 |
| 2010/0073899 | A1* | 3/2010 | Davison ............ F24F 13/0209 361/825 |

FOREIGN PATENT DOCUMENTS

| DE | 3139054 A1 | 4/2005 |
| EP | 1370125 A1 | 12/2003 |

* cited by examiner

*Primary Examiner* — Lisa Lea Edmonds
(74) *Attorney, Agent, or Firm* — Scully Scott Murphy and Presser; Frank Digiglio (57) ABSTRACT

Housing for at least one electric or electronic device, the housing surrounding a housing interior comprising a storage space, the electric or electronic device being arrangeable in the storage space, the housing comprising a housing upper part, which delimits the housing interior, the housing comprising at least one intermediate ceiling portion, which is arranged in the housing interior below the housing upper part and, together with the housing upper part, encloses at least one intermediate space, the intermediate ceiling portion having at least one cooling air passage, through which cooling air can flow from the storage space into the intermediate space, the housing upper part having at least one cooling air outlet, through which the cooling air can escape outwardly from the intermediate space, wherein the intermediate ceiling portion forms a catching arrangement for dripping water, which infiltrates the intermediate space through the cooling air outlet.

19 Claims, 4 Drawing Sheets

Fig. 8

HOUSING FOR AT LEAST ONE ELECTRIC OR ELECTRONIC DEVICE, AND ELECTRIC OR ELECTRONIC DEVICE COMPRISING THE HOUSING

BACKGROUND OF THE INVENTION

The invention relates to a housing for at least one electric or electronic device. The invention further relates to the electric or electronic device comprising the housing. The housing surrounds a housing interior, the housing interior having a storage space, in which the electric or electronic device can be arranged. The housing comprises a housing upper part, which delimits the housing interior, and at least one intermediate ceiling portion, which is arranged in the housing interior below the housing upper part. The intermediate ceiling portion, together with the housing upper part, encloses an intermediate space. The intermediate ceiling portion has at least one cooling air passage, through which cooling air can flow from the storage space into the intermediate space, the housing upper part having at least one cooling air opening, through which the cooling air can escape outwardly from the intermediate space.

DISCUSSION OF THE PRIOR ART

Housings for electric or electronic devices, in particular computer housings, usually have openings via which the housing can be vented so as to avoid an overheating during operation of the electric or electronic device. Housings are already known that have a water-guiding system for guiding and draining off condensation water and/or dripping water.

By way of example, document EP 1 370 125 B1, which appears to be the closest prior art, describes a device for the passage of air, comprising a ventilation grid which consists of a frame with a front plate provided with lamellae and/or air slits and a neck-type recess. The device for the passage of air comprises a supporting body which consists of a frame with a peripheral wall surface and with an inner space for receiving the neck-type recess. The supporting body is provided on a side facing away from the ventilation grid with openings for the passage of air and with water drain ridges for draining penetrated splash water and condensation water.

SUMMARY OF THE INVENTION

The object of the invention is to provide a functionally improved housing for an electric or electronic unit or device.

A housing for at least one electric or electronic unit is proposed. The electric or electronic unit is preferably configured as a circuit board, in particular a printed circuit board, as a wire cable and/or as a plug connection.

The housing surrounds a housing interior, which has a storage space. The housing interior preferably corresponds to a volume of the housing. The electric or electronic unit can be arranged in the storage space.

The housing comprises a housing upper part, which delimits the housing interior, in particular upwardly. The housing can be formed in one part or in a number of parts. The housing preferably has a housing lower part with a housing underside and with a plurality of side walls, the side walls being configurable for example as a front wall and/or rear wall and/or as lateral longitudinal sides.

The housing upper part is preferably fitted and/or can be fitted onto the housing lower part, in particular onto the side walls. The housing upper part is optionally removable from this/these in the multi-part embodiment of the housing without causing damage and/or destruction. In this case, a seal arrangement, for example a flat seal, is preferably arranged between the housing lower part, in particular between at least one of the side walls and the housing upper part. Moisture can thus be prevented from infiltrating by means of a capillary effect between the housing lower part and the housing upper part into the housing interior.

Cooling air can preferably pass continuously through the housing. This means in particular that the housing allows for venting or airing circulations of cooling air. In particular, the house is configured to be cooled by means of forced air cooling. For this purpose, the housing lower part, in particular the housing underside and/or at least one of the side walls, has at least one cooling air inlet. The cooling air can be fed or can flow in through the cooling air inlet from outside, in particular from an environment surrounding the housing, into the housing interior, in particular into the storage space, in order to cool the electric or electronic device arrangeable there. By way of example, the cooling air is blown in actively through the cooling air inlet into the housing interior, for example by use of a blower or fan. It is alternatively possible within the scope of the invention for the cooling air to flow into the housing interior by means of natural air circulation and/or passive convection.

The housing comprises at least one intermediate ceiling portion, which is arranged in the housing interior below the housing upper part. The housing upper part optionally comprises the intermediate ceiling portion. Here, the intermediate ceiling portion can be fixedly connected to the housing upper part or merely detachably coupled thereto. By way of example, the intermediate ceiling portion is configured as a ceiling portion suspended from the housing upper part. The intermediate ceiling portion, however, may also be configured as a separate component.

The intermediate ceiling portion, together with the housing upper part, encloses an intermediate space. In particular, the housing interior comprises the intermediate space. The intermediate ceiling portion has at least one cooling air passage, through which the cooling air can flow from the storage space into the intermediate space.

The housing upper part has at least one cooling air outlet, through which the cooling air can escape outwardly from the intermediate space. The cooling air outlet is preferably configured as at least one opening and/or bore in the housing upper part.

The intermediate ceiling portion forms a catching arrangement for dripping water, in particular condensation water, which infiltrates the intermediate space through the cooling air outlet. The intermediate ceiling portion is preferably arranged below the housing cover and also in a manner congruent or overlapping with the cooling air outlet. The dripping water can thus drip into the intermediate ceiling portion through the cooling air outlet. By way of example, the intermediate ceiling portion, as the catching arrangement, is configured as a collecting channel, as a groove and/or trough for the dripping water. Optionally additionally, the intermediate ceiling portion is configured as a run-off arrangement. In this case, the dripping water cannot only be collected in the intermediate ceiling portion, but can also be guided in the intermediate ceiling portion, for example to a drainage opening, or can run off to the drainage opening.

It is advantageous that the cooling air can escape through the cooling air outlet from the housing interior and that, at the same time, the dripping water infiltrating through the cooling air outlet can be collected in the catching arrangement. As a result, the dripping water can be prevented from infiltrating the storage space and damaging the electric or electronic unit that can be arranged and/or is arranged there.

A simple device construction can be achieved with the intermediate ceiling portion proposed within the scope of the invention. In particular, the intermediate ceiling portion, as the catching arrangement, requires only a small installation space in the housing interior. It is thus ensured that the housing interior is utilized in the best possible way. In particular, receptacles and/or mounting surfaces of the electric or electronic unit are substantially unrestricted.

To summarize, the housing proposed within the scope of the invention advantageously enables forced air cooling with simultaneous drip waterproofness.

In a particularly preferred structural implementation, the intermediate ceiling portion is U-shaped in a vertical and/or perpendicular cross section, in particular in a cross section of which the line of section runs parallel to one of the side walls. A first branch of the U is preferably configured as a first intermediate ceiling web, a second branch of the U is preferably configured as a second intermediate ceiling web, and a transverse connection of the U is preferably configured as an intermediate ceiling base. In particular, the first and second intermediate ceiling web protrude at an angle from the intermediate ceiling base in the direction of the housing upper part.

The intermediate ceiling base is optionally arranged parallel to the housing upper part. The catching arrangement and optionally additionally the run-off arrangement is preferably formed by the U-shaped embodiment of the intermediate ceiling portion. In particular, the dripping water can be collected as a result of the U-shaped configuration of the intermediate ceiling portion and can optionally also be drained off. The intermediate ceiling base preferably forms a bottom of the collecting channel.

The intermediate ceiling portion, in particular the intermediate ceiling base, optionally has a slope. Here, the intermediate ceiling portion, in particular the intermediate ceiling base, preferably runs in its longitudinal extension at an incline and/or angle with respect to the housing upper part and/or with respect to one of the side walls in the direction of the drainage opening. The run-off of the dripping water is thus advantageously assisted and accelerated.

Alternatively or optionally additionally, the intermediate ceiling base and/or the inner faces of the intermediate ceiling webs directed to the intermediate ceiling base may have an adhesion-reducing coating, for example a nano coating. What is known as a lotus effect can thus be achieved in the intermediate ceiling portion, as a result of which the dripping water can run off more easily and more quickly to the drainage opening.

It is preferable for a spacing between the first and second intermediate ceiling web and/or a width of the intermediate ceiling base to be dimensioned such that drops of the dripping water are held on the intermediate ceiling base by adhesion.

The cooling air passage is particularly preferably arranged in the first intermediate ceiling web and/or in the second intermediate ceiling web. Alternatively, the cooling air passage is formed by the first and/or second intermediate ceiling web. In particular, the cooling air passage is distanced from the intermediate ceiling base and is arranged so as to be offset upwardly. More specifically, a lower edge of the cooling air outlet is distanced from the intermediate ceiling base, such that the cooling air passage does not reach as far as the intermediate ceiling base. By way of example, the cooling air passage is arranged in an upper third of the first and/or second intermediate ceiling web or even directly below the housing cover in the first and/or second intermediate ceiling web. The portions of the first and/or second intermediate ceiling web arranged below the cooling air passage are configured in particular as water barriers or as weirs against the dripping water. The dripping water collected on the intermediate ceiling base can thus advantageously be prevented from flowing into and/or through the cooing air passage and from infiltrating the storage space of the housing.

The cooling air passage is arranged laterally offset from the cooling air outlet in the vertical and/or perpendicular cross section, in particular in the cross section of which the line of section runs parallel to one of the side walls of the housing. In particular, the cooling air passage, in the cross section, is arranged congruently with the cooling air outlet. Since the cooling air passage, in the cross section, is arranged laterally offset from the cooling air outlet, a direct flow path for the dripping water from the intermediate space into the device interior is avoided. An infiltration of the dripping water into the housing interior can thus advantageously be avoided. To summarize, it is asserted that the housing is open in terms of aeration and is impervious in terms of the dripping water.

As a result of the laterally offset arrangement of the cooling air outlet and cooling air passage in cross section, the dripping water advantageously cannot infiltrate the housing interior in spite of the permeability of the housing for the cooling air. A forced aeration and/or forced ventilation of the housing interior can thus be achieved, which in particular can be implemented with comparatively low financial and/or technical outlay. It is likewise advantageous that a dripping water separation can be achieved without complex airtight channels. Further, with the intermediate ceiling portion according to the invention, a reliable dripping water separation can also be enabled without seals and/or air filter elements provided specifically for this purpose.

In a preferred embodiment of the invention, a first plane running through the cooling air outlet is arranged at an angle to a second plane running through the cooling air passage. Optionally additionally, the cooling air passage and the cooling air outlet are arranged in two planes and/or offset from one another vertically.

The cooling air, when flowing from the storage space through the cooling air passage into the intermediate space and when flowing outwardly from the intermediate space through the cooling air outlet, is particularly preferably deflected at least twice in terms of its flow direction. The flow direction preferably changes at least twice by at least 60 degrees, preferably at least by 90 degrees, in particular by at least 140 degrees and/or at most by 180 degrees. As a result of the deflection of the cooling air over the flow path thereof outwardly from the storage space via the intermediate space, there is no direct flow path for the dripping water from the intermediate space into the storage space.

In a preferred implementation of the invention, the housing upper part has a first and second rib. The first and second rib preferably adjoin the cooling air outlet laterally and protrude at an angle from the housing upper part, in particular at right angles, into the intermediate space. The cooling air outlet thus discharges between the first and second rib in the preferred implementation. Both ribs preferably run continuously and/or parallel to an inner face of the housing upper part directed to the housing interior.

In accordance with a possible embodiment of the invention, the first and second rib are configured as draining ribs for the dripping water infiltrating the intermediate space through the cooling air outlet. The dripping water is thus guided along the first and second rib and drains directly onto the intermediate ceiling base. The dripping water can thus advantageously be prevented from flowing along the inner face of the housing upper part to the side walls and reaching the storage space via these side walls.

At least one of the side walls of the housing preferably has at least one drainage opening. The intermediate ceiling base, as the catching arrangement and as the run-off arrangement, preferably discharges into the at least one drainage opening, such that the dripping water caught and collected there can be guided outwardly. By way of example, the at least one drainage opening is arranged in the front wall or rear wall of the housing.

In accordance with a preferred embodiment of the invention, the housing has at least one diverting arrangement for selectively diverting the dripping water discharged from the drainage opening, for example around plugs. The diverting arrangement is preferably arranged on an outer face, opposite the housing interior, of at least one of the side walls. Alternatively or optionally additionally, the diverting arrangement or a further diverting arrangement is arranged on an inner face of the side walls. By way of example, the diverting arrangement is configured as a diverting shield or as a diverting groove.

In a particularly preferred embodiment of the invention, the housing has a plurality of intermediate ceiling portions, in particular at least three, preferably at least five and/or at most 15 intermediate ceiling portions. The intermediate ceiling portions are preferably interconnected by web connections. In particular, each web connection is arranged between two adjacent intermediate ceiling webs of two adjacent intermediate ceiling portions. The two adjacent intermediate ceiling webs, together with the web connection, optionally form a receptacle, in which the electric or electronic unit, in particular configured as the circuit board, can be arranged. A circuit board can thus be arranged between two adjacent intermediate ceiling portions in each case, in particular perpendicularly to the housing upper part. In particular, the circuit board is plugged and/or fixed between the intermediate ceiling webs of the two adjacent intermediate ceiling portions. Here, the intermediate ceiling webs of the two adjacent intermediate ceiling portions form a mounting surface for the circuit board and/or a circuit board guide. In particular, the circuit board can be held with a form fit and/or frictional fit between the intermediate ceiling webs of the two adjacent intermediate ceiling portions.

In accordance with a possible embodiment of the invention, the plurality of interconnected intermediate ceiling portions form an intermediate plane. The intermediate plane optionally extends below the housing upper part and/or parallel thereto. The intermediate plane is preferably labyrinth-like and/or forms a labyrinth system. The labyrinth system is preferably arranged substantially in the housing interior. In particular, the labyrinth-like configuration and/or the labyrinth system is/are formed by the cooling air passages preferably arranged in the intermediate ceiling webs distanced from the respective intermediate ceiling base. Alternatively or optionally additionally, the labyrinth-like configuration and/or the labyrinth system is/are formed by the cooling air passage preferably arranged laterally offset from the cooling air outlet. In particular, the cooling air does not pass over a direct "straight" path from the cooling air inlet to the cooling air outlet. Rather, the cooling air, as already described before, is preferably deflected a number of times over the flow path thereof through the housing interior, in particular through the intermediate plane and the intermediate space, as is the case with a labyrinth. The dripping water preferably likewise can be led away outwardly from the labyrinth system due to the specific embodiment of the housing.

It is advantageous that the labyrinth system does not provide a direct flow path of the dripping water into the housing interior and/or into the device interior. An infiltration of external dripping water into the housing interior and/or device interior is thus prevented. In addition, the labyrinth system is optionally configured and designed to lead away the dripping water outwardly. Furthermore, it is advantageous that a relatively simple housing construction and/or device construction can be achieved by the labyrinth system or the labyrinth structure.

The invention further relates to an electric or electronic device, in particular an aviation device, comprising the housing according to one of claims 1 to 12 and/or according to the above description. The electric or electronic device comprises the at least one electric or electronic unit. This is arranged in the storage space and, in particular in the configuration as a circuit board, is inserted between the two adjacent and interconnected intermediate ceiling portions. The cooling air, which preferably flows into the storage space through cooling air inlets in the housing lower part, in particular in the housing underside, is guided upwardly to the cooling air passage perpendicularly to a surface extension of the housing upper part along the preferably perpendicularly arranged circuit board. The circuit board can thus be cooled particularly effectively by the cooling air.

The electric or electronic device is particularly preferably configured as a computer, in particular as an avionics computer for the aviation industry, in particular for integration in an aircraft. By way of example, the electric or electronic device is configured in accordance with the ARINC 600 standard. Devices according to the ARINC 600 standard, depending on the power loss, usually have a large number of cooling outlets. Here, 160 cooling air outlets, for example, with a diameter in each case of 3.2 millimetres can be introduced into the housing upper part. Alternatively, more than 160 cooling air outlets can be introduced into the housing upper part, wherein these may also have different diameters and/or sizes. The housing or the electric or electronic device is preferably configured in accordance with the ARINC 600 standard.

The cooling air outlets are preferably configured in terms of number and diameter and/or size such that they have a total outlet cross section with which, in the event of a failure of the active cooling of the device, in particular in the event of a failure of an aircraft-side cooling air supply, a heat loss can escape from the housing interior via natural convection. It can thus be ensured advantageously that the electric or electronic device remains functional for a certain period of time at a specific ambient temperature.

A dripping water test with the device according to the invention is specified in DO-160 Section 10, Cat. W (DO-160: Environmental Conditions and Test Procedures for Airborne Equipment). With application of 140 litres of water per square meter per hour ($l/m^2/h$) and with a drop height of one meter onto the housing upper side for the device described here, 2.15 litres of dripping water are therefore produced in 15 minutes.

The housing proposed within the scope of the invention, as a result of the dripping water separation, means that a coating of the at least one electric or electronic unit, in particular of the at least one printed circuit board, the wire cable and/or plug connections, is not absolutely necessary. Time and costs when producing the electric or electronic device can thus be saved. As background information it should be mentioned that wire cables and/or circuit boards in the housing can be coated at least in part by a protective coating and thus protected against the dripping water. However, there are also areas, in particular in the area of plug connections, that can only be made waterproof, for example coated, with extremely high economic and/or technical outlay. In particular, a complete protective coating in the area of the plug connections could have negative effects for the maintainability of the electric or electronic device.

To summarize, the present invention makes it possible to realize an "open" device through which cooling air is passed with simple housing construction.

BRIEF DESCRIPTION OF THE DRAWINGS

Further features, effects and advantages of the invention will emerge from the following description of preferred exemplary embodiments of the invention and from the accompanying figures, in which.

DETAILED DESCRIPTION OF THE INVENTION

Figure 1:
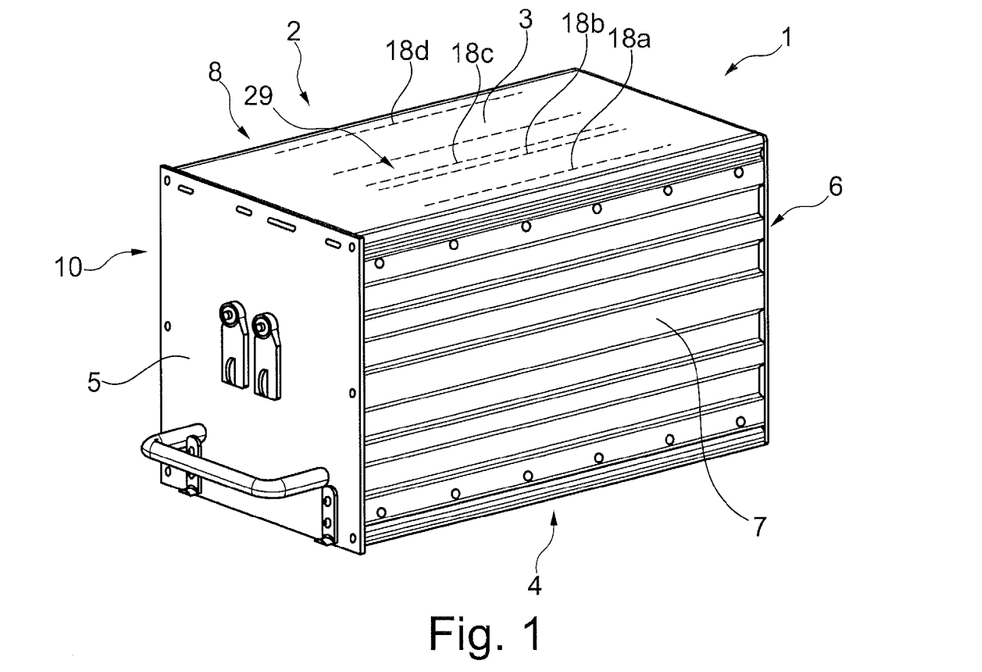
FIG. 1 shows a perspective view of an electric device with a housing, which has a housing upper part and a housing lower part.

FIG. 1 shows a perspective view of an electric or electronic device 1 comprising a housing 2. The electric or electronic device 1 is configured as an avionics computer for the aviation industry. It comprises at least one electric or electronic unit 16, in particular a circuit board (see FIGS. 3 and 7).

Figure 4:
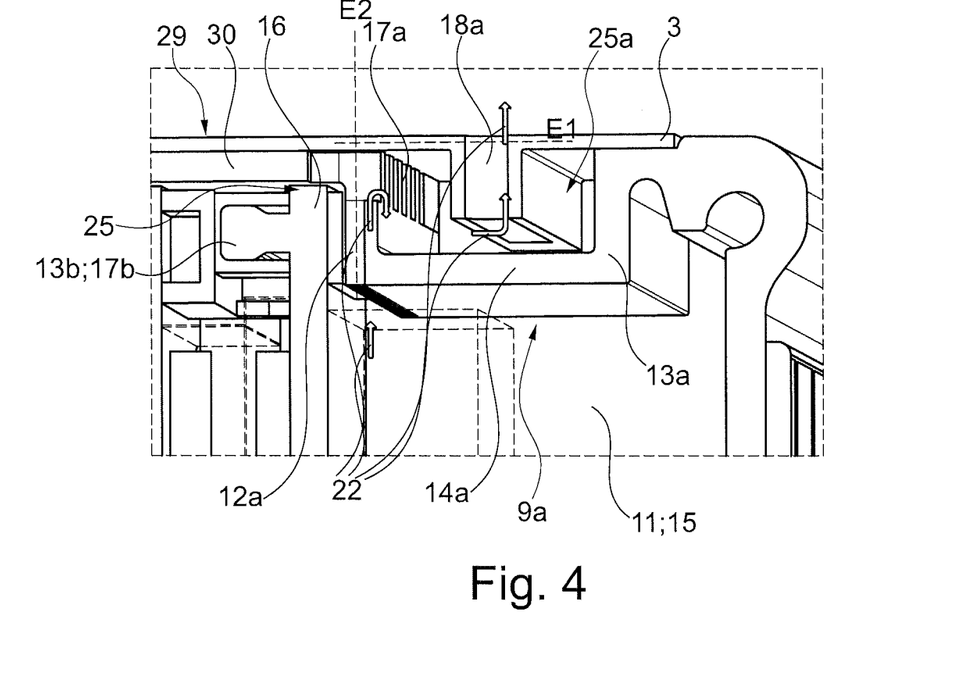
FIG. 4 shows a detail from the sectional view of FIG. 3, in which a flow path of a cooling air is shown.
Figure 7:
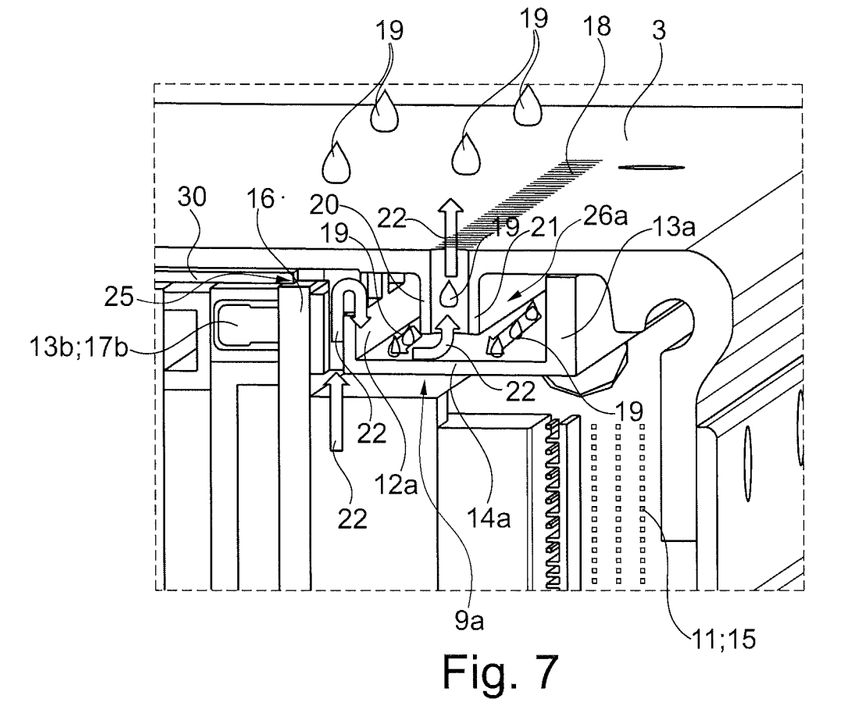
FIG. 7 shows the detail from FIG. 3, in which the flow path of the cooling air and a flow path of a dripping water are shown.

The housing 2 encloses a housing interior 11 (FIGS. 4 and 7). The housing interior 11 comprises a storage space 15 (FIGS. 4 and 7), in which the electric or electronic unit 16 is arranged. The housing 2 is formed in a number of parts and has a housing upper part 3 and a housing lower part 10. The housing upper part 3 can be removed from the housing lower part 10 without causing damage and/or destruction. The housing lower part 10 comprises a housing underside 4 and a plurality of side walls 5; 6; 7; 8, in particular a front face 5, a rear face 6 and two lateral longitudinal sides 7; 8.

The housing lower part 10, preferably the housing underside 4, has cooling air inlets (not shown), through which cooling air 22 for cooling the electric or electronic unit 16 can flow into the housing interior 11 (see FIGS. 4 and 7), in particular in the storage space 15. For this purpose, the housing 2 or the electric device 1 has a venting arrangement (likewise not shown), for example a blower or a fan, by means of which the cooling air 22 can be blown actively into the housing interior 11.

A plurality of cooling air outlets 18a; 18b; 18c; 18d are arranged in the housing upper part 3. Each cooling air outlet 18a; 18b; 18c; 18d is formed by a plurality of openings, in particular bores, strung together in a longitudinal extension of the housing upper part 3 and/or arranged in a line. The cooling air 22 flowing into the housing interior 11 through the housing lower part 10 can escape from the housing again through the cooling air outlets 18a; 18b; 18c; 18d. A circulation and/or forced air cooling of the electric device 1 can thus be achieved.

Figure 2:
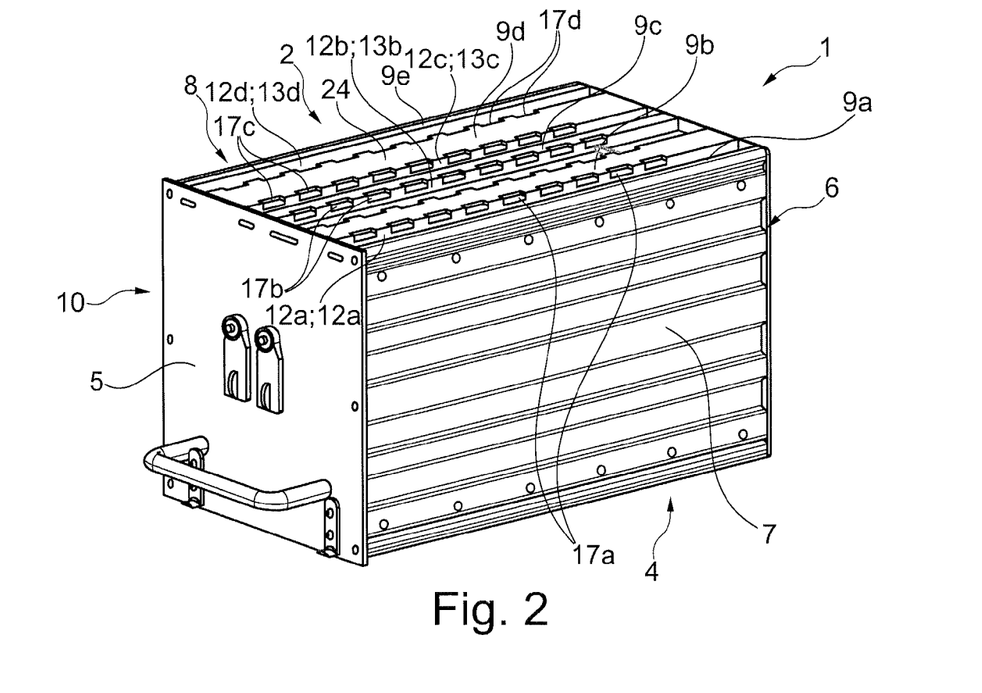
FIG. 2 shows the electric device from FIG. 1, the housing upper part being removed from the housing lower part.

FIG. 2 shows the electric or electronic device 1 with the housing 2 from FIG. 1, the housing upper part 3 being removed from the housing lower part 10. The view of a plurality of interconnected intermediate ceiling portions 9a; 9b; 9c; 9d; 9e (see also FIG. 3) is thus unblocked, the intermediate ceiling portions forming an intermediate plane 24 arranged in the housing interior 11 and below the housing upper part 3. The intermediate plane 24 can be inserted as a separate component into the housing lower part 10. However, it is also possible for the housing upper part 3 to comprise the intermediate plane 24 and for this to be fixedly connected to the housing upper part 3. The intermediate plane 24 runs parallel to an inner face 28 directed to the housing interior 11 and/or to an outer face 29 of the housing upper part 3 opposite the inner face 28 when the housing upper part is fitted on the housing lower part 10.

The intermediate plane 24 comprises a plurality of intermediate ceiling webs 12a; 12b; 12d; 12e; 13a; 13b; 13c; 13e (see also FIG. 3), which protrude and/or project upwardly, in particular in the direction of the housing upper part 3. The intermediate ceiling webs 12a; 12b; 12d; 12e; 13a; 13b; 13c; 13e run continuously in the longitudinal extension of the housing 2 and are formed and/or arranged parallel to the inner face and/or outer face 28; 29 of the housing upper part 3. The intermediate plane 24 is labyrinth-like and/or forms a labyrinth system.

The intermediate plane 24 has cooling air passages 17a; 17b; 17c; 17d; 17e, through which the cooling air 22 can flow from the storage space 15 through the intermediate plane 24 to the cooling air outlets 8a; 18b; 18c; 18d in the housing upper part 3. In particular, one intermediate ceiling web, some intermediate ceiling webs or each intermediate ceiling web 12a; 12b; 12d; 12e; 13a; 13b; 13c; 13e has/have a cooling air passage 17a; 17b; 17c; 17d; 17e. Each cooling air passage 17a; 17b; 17c; 17d; 17e is formed by a plurality of openings, which are strung together and/or arranged in a line and which are arranged along the respective intermediate ceiling web 12a; 12b; 12d; 12e; 13a; 13b; 13c; 13e.

Figure 3:
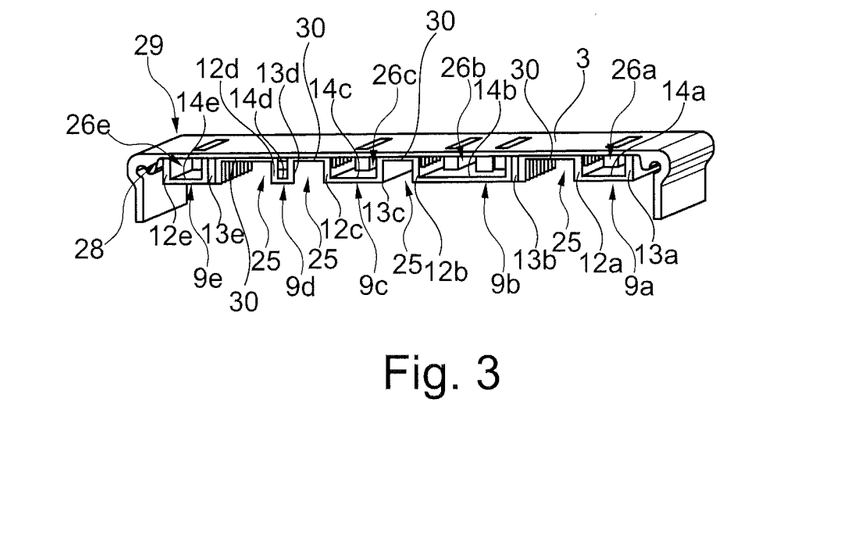
FIG. 3 shows a sectional view through the housing upper part, a line of section running parallel to a front face of the housing.

FIG. 3 shows a section through the housing upper part 3 and through the interconnected intermediate ceiling portions 9a; 9b; 9c; 9d; 9e from FIGS. 1 and 2, the line of section running vertically and/or perpendicularly and in particular parallel to the end face 5. The intermediate ceiling portions 9a; 9b; 9c; 9d; 9e are arranged below the housing upper part 3 and are fastened to the inner face 28 of the housing upper part 3.

Each intermediate ceiling portion 9a; 9b; 9c; 9d; 9e is U-shaped in cross section. A first branch of the U is configured as a first intermediate ceiling web 12a; 12b; 12d; 12e, and a second branch of the U is configured as a second intermediate ceiling web 13a; 13b; 13c; 13e of the respective intermediate ceiling portion 9a; 9b; 9c; 9d; 9e. The transverse connection of the U is formed by an intermediate ceiling base 14a; 14b; 14c; 14d; 14e of the respective intermediate ceiling portion 9a; 9b; 9c; 9d; 9e.

Each intermediate ceiling portion 9a; 9b; 9c; 9d; 9e is configured as a ceiling suspended from the housing upper part 3. Each intermediate ceiling portion 9a; 9b; 9c; 9d; 9e thus encloses an intermediate space 26a; 26b; 26c; 26d; 26e between the respective intermediate ceiling base 14*a*; 14*b*; 14*c*; 14*d*; 14*e* and the inner face 28 of the housing upper part 3.

Each two intermediate ceiling portions 9*a*; 9*b*; 9*c*; 9*d*; 9*e* arranged adjacently to one another are interconnected by a web connection 30. In particular, a web connection 30 always connects two adjacent intermediate ceiling webs 12*a*; 13*b*; 12*b*; 13*c*; 12*c*; 13*e*; 12*d*; 13*e* of two adjacent intermediate ceiling portions 9*a*; 9*b*; 9*c*; 9*d*; 9*e*.

The adjacent intermediate ceiling webs 12*a*; 13*b*; 12*b*; 13*c*; 12*c*; 13*d*; 12*d*; 13*e* in each case, together with the respective web connection 30, form a receptacle 25, in which the electric electronic unit 16, in particular in the form of the circuit board (see FIGS. 4 and 7), can be arranged.

FIG. 4 shows a detail from the sectional illustration of FIG. 3, in which the intermediate ceiling portion 9*a* is illustrated in an enlarged view. In particular, a flow path of the cooling air 22 is shown by arrows.

The intermediate ceiling portion 9*a* comprises the first intermediate ceiling web 12*a*, the second intermediate ceiling web 13*a* and the intermediate ceiling base 14*a*. This, together with the housing upper part 3, encloses the intermediate space 15.

The intermediate ceiling portion 9*a* comprises the cooling air passage 17*a*. This is arranged in the first intermediate ceiling web 12*a* and/or is formed thereby. In particular, the cooling air passage 17*a* is arranged at an upper end of the first intermediate ceiling web 12*a*, preferably directly below the housing upper part 3. The cooling air passage 17*a* is thus distanced and offset upwardly from the intermediate ceiling base 14*a*.

The housing upper part 3 comprises the cooling air outlet 18*a*. The cooling air outlet 18*a* is laterally offset from the cooling air outlet 17*a* in section. In particular, a first plane E1 running through the cooling air outlet 18*a* is arranged perpendicularly to a second plane E2 running through the cooling air passage 17*a*. The cooling air outlet 19*a* and the cooling air passage 17*a* are thus arranged congruently to one another. Furthermore, the cooling air passage 17*a* is offset vertically in relation to the cooling air outlet 18*a*. The lateral and vertically offset arrangement of the cooling air outlet 18*a* relative to the cooling air passage 17*a* assists the labyrinth-like arrangement and configuration of the intermediate plane 25 or of the intermediate ceiling portions 9*a*; 9*b*; 9*c*; 9*d*; 9*e* interconnected via the web connections 30.

The housing interior 11 comprises the storage space 15, in which the electric or electronic unit 16 in the form of the circuit board is arranged perpendicularly to the inner face and/or outer face 28; 29 of the housing upper part 3. For secure mounting, the circuit board is inserted into the receptacle 25, which is formed by the first intermediate ceiling web 12*a* of the intermediate ceiling portion 9*a* and the adjacent second intermediate ceiling web 13*b* of the intermediate ceiling portion 9*b* and by the web connection 30. The circuit board is held in the receptacle 25 with a form fit and/or friction fit between two mounting surfaces of the two intermediate ceiling webs 12*a*; 13*b*.

The cooling air 22 flowing into the storage space 15 through the housing underside 4 flows upwardly along the circuit board 16 arranged perpendicularly to the inner face and/or outer face 28; 29 of the housing upper part 3. The cooling air 22 flows through the cooling air passage 17*a* into the intermediate space 26*a*. From the intermediate space 26*a*, the cooling air 22 can escape outwardly through the cooling air outlet 18*a*, in particular into an environment surrounding the housing 2. As can be clearly seen with reference to the arrows illustrating the cooling air 22, the cooling air 22 is deflected over its flow path from the storage space 15 via the cooling air passage 17*a* into the intermediate space 26*a* by at least 90 degrees, preferably by at least 140 degrees and at most by 180 degrees. The cooling air 22, over its flow path from the intermediate space 26 via the cooling air outlet 18*a* outwardly, is deflected in terms of its flow direction by at least 60 degrees, preferably by at least 90 degrees and at most by 180 degrees.

In particular, due to the labyrinth-like arrangement and configuration of the intermediate plane 24 (see FIG. 2), the cooling air 22 does not flow directly over a straight path through the housing interior 11, but is diverted a number of times, in particular twice as just described, in its flow direction over its path through the housing interior 11. At the same time, as a result of the labyrinth-like configuration and/or arrangement of the intermediate plane 24, the dripping water 19 caught and collected in the intermediate ceiling portion 9*a* cannot reach the storage space 15.

FIG. 7 shows the illustration of FIG. 4, in particular a detail of the intermediate ceiling portion 9*a* and of the cooling air outlet 18*a*. In addition to the flow path of the cooling air 22, a flow path of dripping water 19, in particular condensation water, is illustrated by droplet symbols. The flow path is shown by way of example for all further intermediate ceiling portions 9*b*; 9*c*; 9*d*; 9*e* and cooling air outlets 18*b*; 18*c*; 18*d*; 18*e*.

The housing upper part 3 has a first and a second rib 20; 21, which adjoin the cooling air outlet 18*a* laterally and protrude from the housing upper part 3 at right angles into the intermediate space 26*a*. The dripping water 19 passes through the cooling air outlet 18*a* into the intermediate space 26*a* by flowing along the first and second rib 20; 21.

The first and second rib 20; 21 are configured as draining ribs for the infiltrating dripping water 19. In particular, the dripping water 19 is conveyed along the draining ribs 20; 21 into the intermediate space 26*a* by draining directly onto the intermediate ceiling base 14*a*. Due to the draining ribs 20; 21, the dripping water 19 is advantageously prevented from migrating along the inner face 28 of the housing upper part 3 in the direction of at least one of the side walls 5; 6; 7; 8 and from then passing into the storage space 15.

The dripping water 19 is caught in the intermediate ceiling portion 9*a* on the intermediate ceiling base 14*a*. Due to its U-shaped embodiment, the intermediate ceiling portion 9*a* forms a collecting channel for the infiltrating dripping water 19. Since the cooling air passage 17*a* in the first intermediate ceiling web 12*a* is offset upwardly and distanced from the intermediate ceiling base 14*a*, a region of the intermediate ceiling web 12*a* arranged therebelow forms a water barrier and/or a weir against the caught and collected dripping water. In particular, this water cannot infiltrate the storage space 15 through the cooling air passage 17*a*. There is thus no direct flow path from the intermediate space 26*e* into the storage space 15 for the dripping water.

Figure 5:
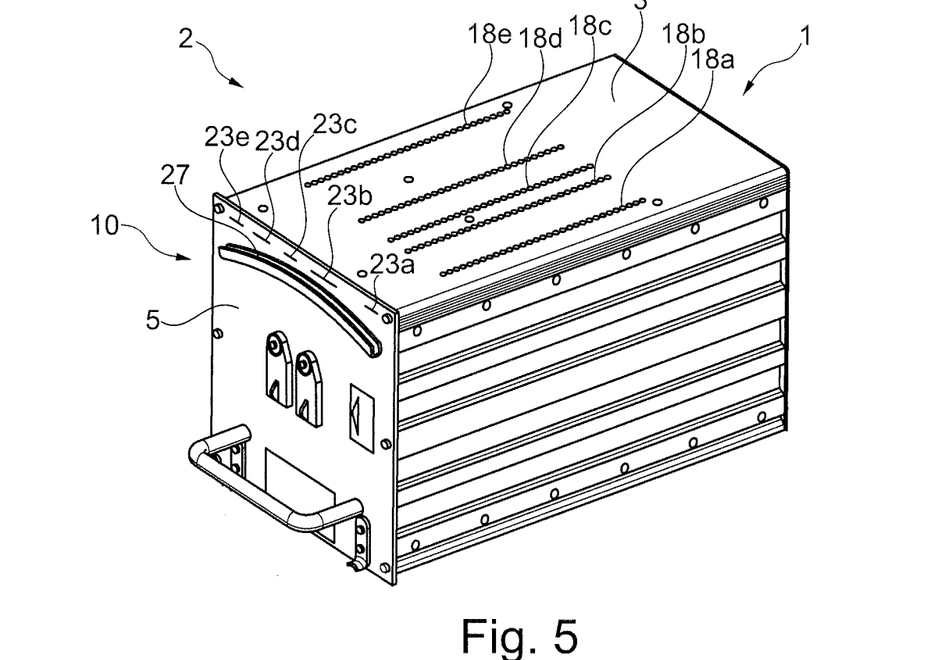
FIG. 5 shows the electric device from FIG. 1 with an alternative housing.

FIG. 5 shows the electric device 1 from FIG. 1 with a modified housing 2. The end face 5 of the housing 2 has a plurality of drainage openings 23*a*; 23*b*; 23*c*; 23*d*; 23*e*, through which the dripping water 19 caught in the individual intermediate ceiling portions 9*a*; 9*b*; 9*c*; 9*d*; 9*e* (see FIG. 7 by way of example) can be drained outwardly, through the end face 5.

Figure 6:
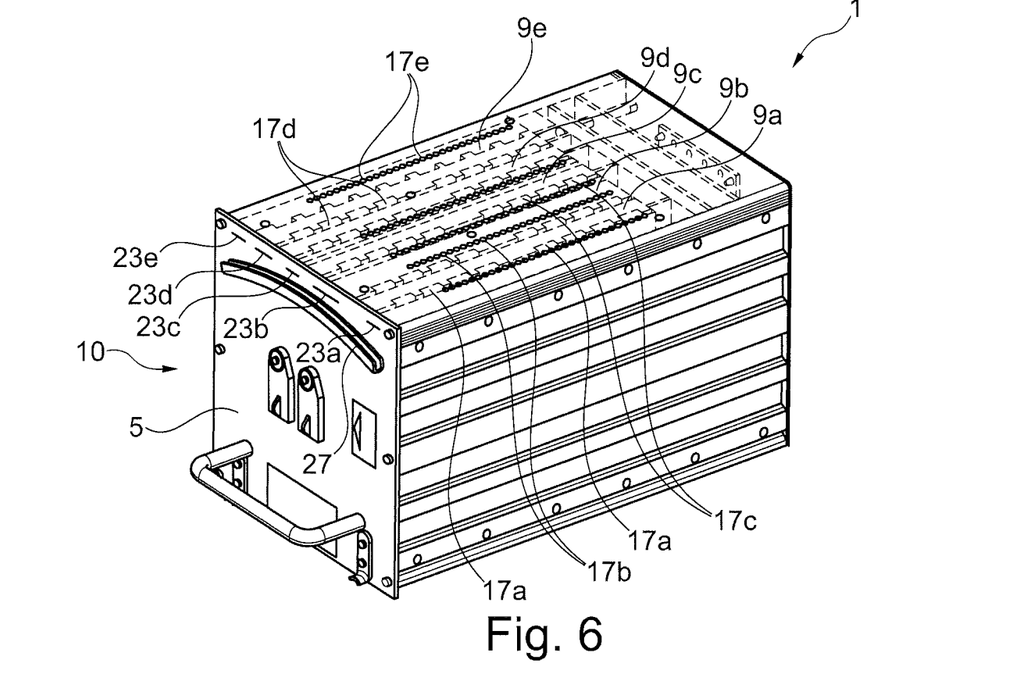
FIG. 6 shows the electric device with the alternative housing from FIG. 5, the housing upper part being removed from the housing lower part.

FIG. 6 shows the electric device 1 with the modified housing 2 from FIG. 5, the housing upper part 3 being removed from the housing lower part 10. Each intermediate ceiling portion 9*a*; 9*b*; 9*c*; 9*d*; 9*e* discharges into the drainage opening 23*a*; 23*b*; 23*c*; 23*d*; 23*e* associated therewith so that the dripping water 19 can drain outwardly therefrom.

The housing 2 has a diverting arrangement 27, which is configured to divert the dripping water 19 discharged from the drainage openings 23a; 23b; 23c; 23d. The diverting arrangement 27 is arranged on the end face 5 of the housing 2 and is constructed as a convexly curved diverting groove. The dripping water 19 can thus be bypassed selectively around sockets and/or plugs, which are arranged on the end face 9.

Figure 8:
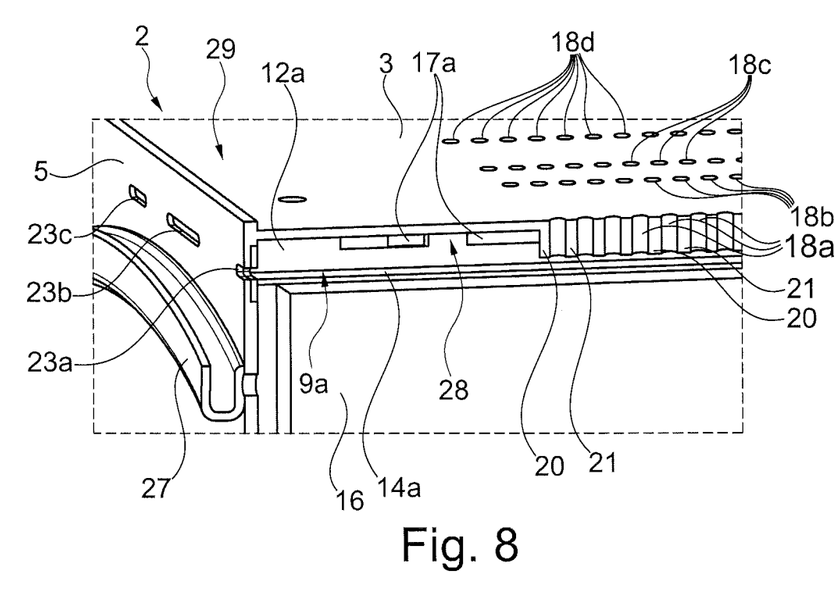
FIG. 8 shows a detail of the alternative housing from FIG. 5, a first lateral longitudinal side of the housing and part of the housing upper part being illustrated transparently.

In FIG. 8 the electric or electronic device 1 with the modified housing 2 from FIG. 5 is shown, wherein the first lateral longitudinal side 7 and part of the housing upper part 3 are illustrated transparently. Due to the transparent illustration, the view of the circuit board 16 arranged perpendicularly to the inner face and/or outer face 28; 29 of the housing upper part 3 is unblocked. The housing upper part 3 comprises the cooling air outlets 18a; 18b; 18c; 18d. Due to the transparency, the view of the first and second bead 20; 21, in particular drainage beads, at which the dripping water 19 infiltrating through the cooling air outlet 18a drains purposefully onto the intermediate ceiling base 14a, is unblocked. The intermediate ceiling portion 9a with the intermediate ceiling base 14a and the intermediate ceiling web 12a are also visible. The upwardly offset cooling air passage 17a arranged at a distance from the intermediate ceiling base 14a is arranged in the intermediate ceiling web 12a. The region arranged therebelow of the intermediate ceiling web 12a is configured as the weir or as the barrier against the dripping water 19 collected in the intermediate ceiling portion 9a.

To summarize, an open device 1, in particular a housing 2, through which cooling air 22 can flow continuously and which is vented by forced air venting is provided in accordance with FIGS. 1 and 5, and therefore the electric or electronic unit can be cooled during operation, and an overheating of the electric device 1 can be avoided. At the same time, due to the labyrinth-like configuration of the intermediate plane 24 in accordance with FIG. 2 and/or due to the specific configuration and arrangement of the intermediate ceiling portions 9a; 9b; 9c; 9d; 9e with the laterally and vertically offset cooling air outlets and passages 18a; 17a; 18b; 17b; 18c; 17c; 18d; 17d; 18e; 17e shown in FIGS. 3; 4; 6; 7 and 8, it is possible to ensure that no dripping water 19 can pass into the storage space 15 of the housing 2, in spite of the open device 1 vented by means of forced air venting.

LIST OF REFERENCE SIGNS 1 electric or electronic device
2 housing
3 housing upper part
4 housing underside
5 front face
6 rear face
7 first lateral longitudinal side
8 second lateral longitudinal side
9a-e intermediate ceiling portions
10 housing lower part
11 housing interior
12a-e intermediate ceiling web
13a-e intermediate ceiling web
14a-e intermediate ceiling base
15a-e storage space
16 electric or electronic unit
17a-e cooling air passage
18a-e cooling air outlet
19 dripping water
20 first rib
21 second rib
22 cooling air
23a-e drainage openings
24 intermediate plane
25 receptacle for circuit board
26a-e intermediate space
27 diverting arrangement
28 inner face of the housing upper part
29 outer face of the housing upper part
30 web connection

What is claimed is:

1. A housing for at least one electric or electronic unit,
the housing surrounding a housing interior comprising a storage space, the electric or electronic unit being arrangeable in the storage space,
the housing comprising a housing upper part, which delimits the housing interior,
the housing comprising at least one intermediate ceiling portion, which is arranged in the housing interior below the housing upper part and, together with the housing upper part, encloses at least one intermediate space,
the intermediate ceiling portion having at least one cooling air passage, through which cooling air can flow from the storage space into the intermediate space,
the housing upper part having at least one cooling air outlet, through which the cooling air can escape outwardly from the intermediate space,
wherein
the intermediate ceiling portion forms a catching arrangement for dripping water, which infiltrates the intermediate space through the cooling air outlet.

2. The housing according to claim 1, wherein the intermediate ceiling portion is U-shaped in a perpendicular and/or vertical cross section, a first branch of the U being configured as a first intermediate ceiling web, a second branch of the U being configured as a second intermediate ceiling web, and a transverse connection of the U being configured as an intermediate ceiling base.

3. The housing according to claim 2, wherein the cooling air passage is arranged in the first intermediate ceiling web and/or in the second intermediate ceiling web, and/or is formed by the first intermediate ceiling web and/or second intermediate ceiling web.

4. The housing according to claim 2, wherein the cooling air passage is distanced from the intermediate ceiling base and is offset upwardly, such that the dripping water caught on the intermediate ceiling base is prevented from infiltrating the storage space of the housing through the cooling air passage.

5. The housing according to claim 1, wherein the cooling air passage is laterally offset from the cooling air outlet in a perpendicular and/or vertical cross section.

6. The housing according to claim 1, wherein the cooling air, when flowing from the storage space into the intermediate space and when flowing outwardly from the intermediate space, is deflected at least twice in its flow direction by at least 60 degrees.

7. The housing according to claim 1, wherein the cooling air, when flowing from the storage space into the intermediate space and when flowing outwardly from the intermediate space, is deflected at least twice in its flow direction by at least 90 degrees.

8. The housing according to claim 1, wherein the cooling air, when flowing from the storage space into the intermediate space and when flowing outwardly from the intermediate space, is deflected at least twice in its flow direction by at least 140 degrees.

9. The housing according to claim 1, wherein the cooling air, when flowing from the storage space into the intermediate space and when flowing outwardly from the intermediate space, is deflected at least twice in its flow direction by at most by 180 degrees.

10. The housing according to claim 1, wherein the housing upper part has a first rib and second rib, the first and second rib adjoining the cooling air outlet laterally and protruding at an angle from the housing upper part into the intermediate space.

11. The housing according to claim 10, wherein the first and second rib are configured as draining ribs for the dripping water infiltrating the intermediate space through the cooling air outlet.

12. The housing according to claim 1, wherein the housing has a plurality of side walls, at least one of the side walls having at least one drainage opening, into which the intermediate ceiling portion, as the catching arrangement and as a run-off arrangement, discharges, such that the dripping water caught there can be guided outwardly.

13. The housing according to claim 12, wherein the housing has at least one diverting arrangement for selectively diverting the dripping water discharged from the drainage opening.

14. The housing according to claim 1, wherein the housing has a plurality of intermediate ceiling portions, the intermediate ceiling portions being interconnected by web connections.

15. The housing according to claim 14, wherein each web connection is arranged between two adjacent intermediate ceiling webs of two adjacent intermediate ceiling portions, the two adjacent intermediate ceiling webs, together with the web connection, forming a receptacle, in which the electric or electronic unit can be arranged.

16. The housing according to claim 14, wherein the plurality of interconnected intermediate ceiling portions form an intermediate plane, the intermediate plane being labyrinth-like and/or forming a labyrinth system.

17. An electric or electronic device comprising the housing according to claim 1, wherein the electric or electronic device comprises the electric or electronic unit, which is arranged in the storage space in the receptacle formed between the intermediate ceiling webs connected via the web connection, the cooling air being guided upwardly to the cooling air passage, along the electric or electronic unit and perpendicularly to an inner face and/or outer face of the housing upper part.

18. The electric or electronic device according to claim 17, wherein the electric or electronic device is configured as a computer.

19. The electric or electronic device according to claim 18, wherein said computer is an avionics computer.

\* \* \* \* \*